US009431095B1

(12) United States Patent
Wu

(10) Patent No.: US 9,431,095 B1
(45) Date of Patent: Aug. 30, 2016

(54) HIGH-DENSITY INTEGRATED CIRCUIT MEMORY

(71) Applicant: Xilinx, Inc., San Jose, CA (US)

(72) Inventor: Ephrem C. Wu, San Mateo, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/566,371

(22) Filed: Dec. 10, 2014

(51) Int. Cl.
*G11C 7/00* (2006.01)
*G11C 11/418* (2006.01)
*G11C 7/22* (2006.01)
*G11C 7/06* (2006.01)

(52) U.S. Cl.
CPC ............... *G11C 11/418* (2013.01); *G11C 7/22* (2013.01); *G11C 7/06* (2013.01)

(58) Field of Classification Search
None
See application file for complete search history.

(56) References Cited

U.S. PATENT DOCUMENTS 5,504,710 A * 4/1996 Somon ................ G11C 7/1006 365/189.05
5,838,681 A * 11/1998 Bonomi ................ H04L 49/25 370/395.41
5,841,771 A * 11/1998 Irwin ................ H04L 12/5601 370/360
2005/0242835 A1* 11/2005 Vadi ................ H03K 19/173 326/37
2014/0254232 A1 9/2014 Wu

OTHER PUBLICATIONS

Specification and drawings for U.S. Appl. No. 14/278,244, filed May 15, 2014, Wu et al.

* cited by examiner

*Primary Examiner* — Son Dinh
*Assistant Examiner* — Uyen B Tran
(74) *Attorney, Agent, or Firm* — Kevin T. Cuenot

(57) ABSTRACT

A memory circuit includes an input stage having N input ports and N output ports, wherein N is an integer greater than one. The memory circuit further includes an N:1 port multiplexer coupled to the N output ports of the input stage and configured to time division multiplex the N output ports to one multiplexed port. The memory circuit also includes a random access memory matrix and a 1:N port multiplexer. The memory circuit is coupled to the multiplexed port. The 1:N port multiplexer is coupled to the random access memory matrix and is configured to de-multiplex signals received from the random access memory matrix into N output ports.

18 Claims, 7 Drawing Sheets

HIGH-DENSITY INTEGRATED CIRCUIT MEMORY

TECHNICAL FIELD

This disclosure relates to integrated circuits (ICs) and, more particularly, to high density memory for an IC.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices.

Programmable ICs may also be implemented in other ways, e.g., using fuse or antifuse technology. The phrase "programmable IC" may include, but is not limited to, these devices and further may encompass devices that are only partially programmable. For example, one type of programmable IC includes a combination of hard-coded transistor logic and a programmable switch fabric that programmably interconnects the hard-coded transistor logic.

Modern programmable ICs are able to provide significant memory bandwidth. The infrastructure of such programmable ICs, for example, is able to read and/or write large amounts of data concurrently. The amount of data that may be stored at any given time on-chip, however, may not be sufficient for high frequency applications. In illustration, some modern applications require packet buffering at data rates of approximately 400 Gigabits per second (Gb/s). A router processing data at a 400 Gb/s data rate typically requires sufficient on-chip memory to store 1 millisecond worth of data within a transient buffer. A programmable IC with an on-chip memory capacity in the range of 50-66 megabytes is only able to provide a fraction of the on-chip memory capacity needed for such an application.

SUMMARY

A memory circuit includes an input stage having N input ports and N output ports, wherein N is an integer greater than one, and an N:1 port multiplexer coupled to the N output ports of the input stage and configured to time division multiplex the N output ports to one multiplexed port. The memory circuit further includes a random access memory (RAM) matrix coupled to the multiplexed port and a 1:N port multiplexer coupled to the RAM matrix. The 1:N port multiplexer is configured to de-multiplex signals from the RAM matrix into N output ports.

A method includes receiving memory operations on N input ports, wherein each of the N input ports operates at a first data rate, time division multiplexing the memory operations to a single port having a second data rate that is at least N times the first data rate, and providing the multiplexed memory operations from the single port to a RAM matrix. The RAM matrix operates at least at the second data rate. The method further includes implementing the memory operations in the RAM matrix serially.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
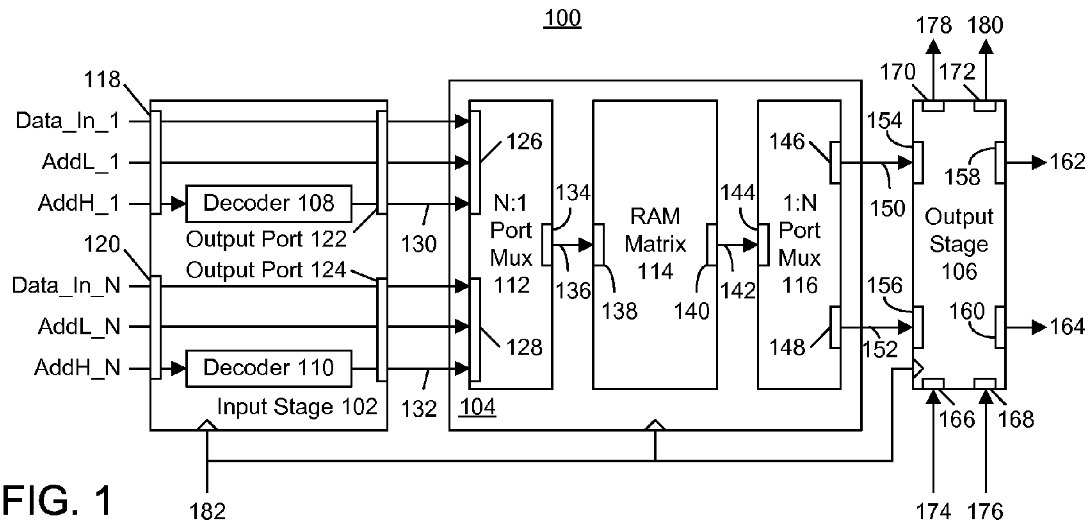
FIG. 1 is a block diagram illustrating an exemplary memory circuit.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to high density memory for an IC. In accordance with the inventive arrangements described herein, a memory circuit is provided. The memory circuit includes a random access memory (RAM) matrix and time-division multiplexing (TDM) circuitry. The TDM circuitry facilitates the consolidation of a plurality of input ports to a single input port that interfaces with the RAM matrix. An output port of the RAM matrix may be de-multiplexed by the TDM circuitry to a plurality of output ports. In another aspect, the RAM matrix may include a single port functioning as both an input and an output port. The RAM matrix has a data throughput that is faster than other individual ports of the memory circuit and circuitry surrounding the memory circuit as a whole. In one aspect, the memory circuit has a reduced size due to the use of fewer input ports and output ports as supported by the TDM circuitry.

In another aspect, the memory circuit includes address decoding circuitry. The address decoding circuitry may be included for the plurality of input ports prior to time division multiplexing the ports. The address decoding circuitry supports the selective activation and deactivation of the input ports. Further, the address decoding, along with various other blocks and/or portions of the memory circuit to be described herein, may be implemented as hardwired, or fixed, circuitry. Thus, while one or more instances of the memory circuit may be included in an IC, such as a programmable IC, the address decoding circuitry and connections among various ones of the memory circuits may be hardwired thereby supporting high performance operation.

The inventive arrangements described within this disclosure may be implemented in any of a variety of different forms. In one aspect, the inventive arrangements described herein may be implemented as an apparatus and/or a system including circuitry. The apparatus and/or system may be implemented as a memory circuit. The apparatus and/or system may be included in an IC. The IC may be a programmable IC. The IC may include one or more instances of the memory circuit with the different instances of the memory circuit being coupled and configurable to implement one or more different memory structures and/or architectures. Further, an IC including the memory circuit(s) disclosed herein may be incorporated into a larger apparatus such as a router, display, other data processing system, or the like.

In another aspect, the inventive arrangements described herein may be implemented as a method. One or more methods may be directed to providing and/or implementing one or more of the memory circuits. One or more methods may be directed to configuring one or more of the memory circuits within an IC to implement a selected memory architecture. One or more methods may also include operations performed by the memory circuit and/or an IC in which one or more of the memory circuits may be implemented during operation of the memory circuit and/or IC.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating an exemplary memory circuit 100. Memory circuit 100 includes an input stage 102, a memory core 104, and an output stage 106. As pictured, input stage 102 includes a decoder 108 and a decoder 110. Memory core 104 includes an N:1 port multiplexer 112 (shown as N:1 port mux in FIG. 1 and hereafter "N:1 mux"), a RAM matrix 114, and a 1:N port multiplexer 116 (shown as 1:N port mux in FIG. 1 and hereafter "1:N mux"). The variable "N" is an integer greater than one. In the example of FIG. 1, N is equal to two (2). It should be appreciated, however, that N may be greater than two depending upon the number of ports desired to interface with circuitry surrounding memory circuit 100.

In the example of FIG. 1, input stage 102 includes N input ports. Input stage 102 includes an input port 1 or first input port referred to as input port 118 and an input port N or Nth input port referred to as input port 120. Input port 118 receives a data signal (Data_In_1), an address low signal (AddL_1), and an address high signal (AddH_1). Input port 120 receives a data signal (Data_In_N), an address low signal (AddL_N), and an address high signal (AddH_N). Each of the various signals illustrated as Data_In_1, AddL_1, AddH_1, Data_In_N, AddL_N, and AddH_N may be implemented as a multi-bit signal.

For each of input ports 118 and 120, a portion of the address signals are provided to decoding circuitry. The decoding circuitry includes decoder 108 and decoder 110. For input port 118, AddH_1 is provided to decoder 108. Decoder 108 decodes AddH_1 and determines whether the corresponding input port of N:1 mux 112, i.e., input port 126, is activated or deactivated. In one aspect, the output from decoder 108 to input port 126 of N:1 mux 112 is a single bit signal referred to as enable signal 130. For input port 120, AddH_N is provided to decoder 110. Decoder 110 decodes AddH_N and determines whether the corresponding input port of N:1 mux 112, i.e., input port 128, is activated or deactivated. In one aspect, the output from decoder 110 to input port 128 of N:1 port mux 112 is a single bit signal referred to as enable signal 132.

Input stage 102 includes an output port 122. Signals Data_In_1, AddL_1, and enable signal 130 are provided to output port 122 and on to input port 126 of N:1 mux 112. Input stage 102 further includes output port 124. The signals Data_In_N, AddL_N, and enable signal 132 are provided to output port 124 and on to input port 128 of N:1 mux 112. While AddH_1 and AddH_N are decoded, signals such as Data_In_1, AddL_1, Data_In_N, and AddL_N may be passed substantially unchanged through input stage 102 to memory core 104. In one aspect, however, signals Data_In_1, AddL_1, AddH_1, Data_In_N, AddL_N, and AddH_N may be registered within input stage 102.

In the example of FIG. 1, N:1 mux 112 includes input ports 126 and 128 that correlate with, and are coupled to, output ports 122 and 124, respectively, of input stage 102. N:1 mux 112 receives signals Data_In_1, AddL_1, enable signal 130, Data_In_N, AddL_N, enable signal 132, and optionally one or more other control signals not illustrated in FIG. 1. N:1 mux 112 is configured to perform time division multiplexing. N:1 mux 112 receives signals on N different ports and consolidates the N ports into 1 port, i.e., output port 134, that provides output signal 136 to RAM matrix 114. As noted, in the example of FIG. 1, N is equal to two (2). Thus, any memory operations received on input port 126 and input port 128 are time division multiplexed and output on output port 134 serially.

Output port 134 is coupled to input port 138 of RAM matrix 114. In one aspect, RAM matrix 114 includes a single input port and a single output port. An output port 140 of RAM matrix 114 is coupled to an input port 144 of 1:N mux 116. Output port 140 provides signal 142, specifying a memory operation result, to 1:N mux 116. As pictured, 1:N mux 116 includes the single input port 144 and N output ports, e.g., output ports 146 and 148. 1:N mux 116 demultiplexes the signals received from the output of RAM matrix 114 back into N ports that are output from 1:N mux 116. More particularly, signals 150 and 152 are output from output ports 146 and 148, respectively.

In one aspect, memory circuit 100 includes an output stage 106. As shown, output stage 106 includes N input ports shown as input ports 154 and 156. Input ports 154 and 156 couple to output ports 146 and 148, respectively, of 1:N mux 116. Output stage 106 provides N output ports shown as output ports 158 and 160. Output port 158 generates signal 162, while output port 160 generates signal 164. It should be appreciated that any signals output from output port 148 of 1:N mux 116 and output port 158 of output stage 106 are memory operation results from memory operations initially received on input port 118. Similarly, any signals output from output port 148 of 1:N mux 116 and output port 160 of output stage 106 are memory operation results from memory operations initially received on input port 120.

Output stage 106 further may include cascade input ports 166 and 168 and cascade output ports 170 and 172. Cascade input ports 166 and 168 received cascade input signals 174 and 176 respectively. Cascade input signals 174 and 176, for example, may be cascade output signals from another instance or physical implementation of memory circuit 100. Cascade output ports 170 and 172 generate cascade output signals 178 and 180, respectively.

In one aspect, output signal 162 may be the same as cascade output signal 178; and, cascade input signal 176 may be output from cascade output port 172 as cascade output signal 180. In another aspect, output signal 164 may be the same as cascade output signal 180; and, cascade input signal 174 may be output from cascade output port 170 as cascade output signal 178. In still another aspect, both output signals 162 and 164 may be the same as cascade output signals 178 and 180. In yet another aspect, both cascade input signals 174 and 176 may be output from cascade ports 170 and 172 as cascade output signals 178 and 180, respectively. The particular signal routing performed by output stage 106 may be determined by loading configuration data into memory circuit 100 and/or by configuration bitstream of the IC in which memory circuit 100 is implemented.

In one exemplary implementation, circuitry coupling cascade input ports and cascade output ports of two or more memory circuits 100 may be hardwired. Output ports 158 and 160, while able to become coupled to other memory circuits, may be used to output memory operation results to other circuits including circuitry and/or systems implemented in programmable circuitry that may be included in the IC in which the memory circuits are included.

As pictured, input stage 102, memory core 104, and output stage 106 may be clocked by a clock signal 182. RAM matrix 114 may have a data throughput, or data rate, that is N times, or at least N times, that of input port 118 or input port 120 of input stage 102 or of output port 162 or of output port 164 of output stage 106. In one aspect, RAM matrix 114 may be self-timed and triggered off of the rising edge of clock signal 182. In that case, RAM matrix 114 is not sensitive to duty cycle distortion on clock signal 182. While memory operations from input ports 126 and 128 are serialized and provided to input port 138, RAM matrix 114 may execute the memory operation originating from input port 118 and, when done processing, immediately execute the memory operation originating from input port 120. For example, responsive to completing a memory operation that originated from input port 118, as indicated by the sense amplifiers of RAM matrix 114, a control signal may be generated within RAM matrix 114. In another example, responsive to the sense amplifiers of RAM matrix 114 latching data, the control signal may be generated. Responsive to the control signal, or a change in state of the control signal, RAM matrix 114 executes a next memory operation originating from input port 120. Upon completing execution of the memory operation originating from input port 120 or the latching of such data, RAM matrix 114 awaits a next rising edge of clock signal 182 to begin processing a next memory operation originating from input port 118. RAM matrix 114 may complete both memory operations originating from ports 118 and 120 in sufficient time to allow a variety of output processing such as error correction or the like.

Thus, in the self-timed case, the data rate is at least N times that of a single input port of input stage 102 and approximately equal to the total throughput of input stage 102 considering all N ports. In the case where RAM matrix 114 is clocked using both the rising and the falling edges, the data rate is 2 times that of a single input port of input stage 102 and approximately equal to the total throughput of input stage 102 considering both ports.

In another aspect, RAM matrix 114 may be triggered off of both the rising and the falling edge of clock signal 182 in the case where N=2. In that case, memory operations originating from input port 118 may be processed on the rising edge of clock signal 182, while memory operations originating from input port 120 may be processed on the falling edge of clock signal 182. Using both the rising and falling edge to trigger execution of memory operations in RAM matrix 114 is, however, sensitive to duty cycle of clock signal 182. Still, it should be appreciated that RAM matrix 114 may process a memory operation in less time than one half of the duty cycle of clock signal 182, which allows the initiation of memory operation execution on both the rising and falling edges of clock signal 182.

Referring to FIG. 1, any circuitry in the same IC as memory circuit 100 that interacts with memory circuit 100 sees two input ports, i.e., input port 118 and input port 120, and two output ports, i.e., output ports 158 and 160. Memory circuit 100 may perform memory operations received on each of input ports 118 and 120 independently of the other input port. Further, the memory operations may be performed without degradation in performance due to address collision. As defined within this specification, the term "memory operation" means a read operation or a write operation. An address collision refers to a situation where two memory operations are received concurrently at input ports 118 and 120 and are directed to a same memory address.

For example, in the event that each of input ports 118 and 120 receives a memory operation directed to a same address at the same time, no collision occurs due to the time division multiplexing performed by N:1 mux 112 in memory core 104. For two memory operations received on input port 118 and input port 120 concurrently, memory core 104, in effect, processes the memory operation from input port 118 first, followed by the memory operation from input port 120. The memory operations are serialized by N:1 mux 112 so that RAM matrix 114 is presented with one memory operation at a time, albeit at a rate that is faster than the operation of either input port 118 or input port 120. It should be appreciated that memory circuit 100 may be configured to process memory operations from input port 120 prior to memory operations from input port 118 if so desired and that the examples provided herein are not intended as limitations.

Within this disclosure, reference is made from time-to-time to a port 1 or a port N of memory circuit 100. Reference to port 1, for example, may refer to the signal path including input port 118, output port 122, input port 126, output port 146, input port 154, and output port 158. Reference to port N, for example, may refer to the signal path including input port 120, output port 124, input port 128, output port 148, input port 156, and output port 160. Further, input ports 118 and 120 may be referred to as the 1-N "input ports" of memory circuit 100. Output ports 158-160 may be referred to as the 1-N output ports of memory circuit 100.

Figure 2:
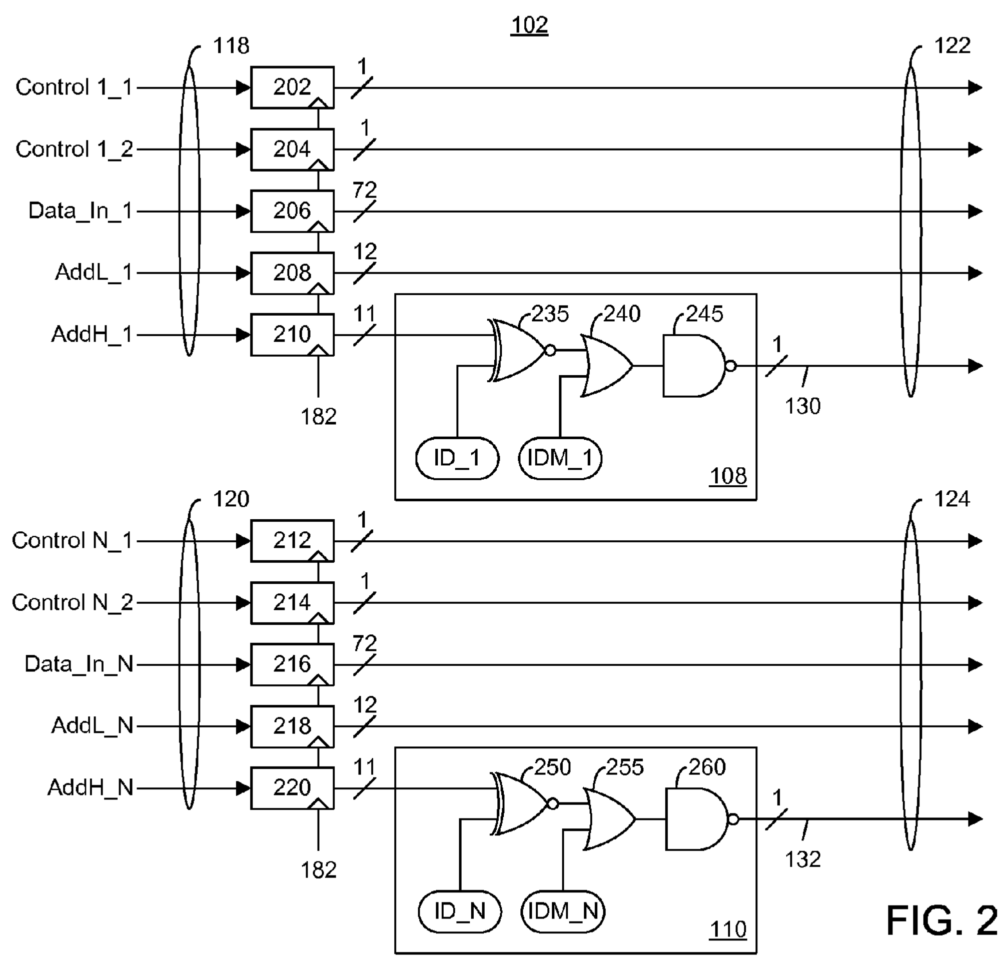
FIG. 2 is a block diagram illustrating an exemplary input stage of the memory circuit of FIG. 1.

FIG. 2 is a block diagram illustrating an exemplary implementation of input stage 102 of memory circuit 100 of FIG. 1. FIG. 2 presents a more detailed illustration of input stage 102. For example, each of input ports 118 and 120 receive additional control signals described below.

As pictured, the signals provided to input ports 118 and 120 are registered. The signal paths defined between input port 118 and output port 122 includes registers 202, 204, 206, 208, and 210. Registers 202-210 are clocked by clock signal 182. The signals control 1_1, control 1_2, Data_In_1, AddL_1, and AddH_1 are provided to inputs of registers 202, 204, 206, 208, and 210, respectively.

Control 1_1 and control 1_2 each may be implemented as single bit signals. Accordingly, registers 202 and 204 may be implemented as single bit registers. In one aspect, control 1_1 may be a read enable signal, while control 1_2 may be a write enable signal. In another aspect, control 1_2 may be a port enable signal, while control 1_2 is a read-write select signal. In that case, control 1_2 indicates whether a read or a write operation is to be performed when control 1_1 indicates that port 118 is enabled.

Data_In_1 may be a 72 bit data signal. Accordingly, register 206 may be 72 bits in width or implemented as 72 single bit registers. AddL_1 may be a 12 bit address signal. Accordingly, register 208 may be 12 bits in width or implemented as 12 single bit registers. AddH_1 may be an 11 bit address signal. Accordingly, register 210 may be 11 bits in width or implemented as 11 single bit registers.

The signal paths defined between input port 120 and output port 124 includes registers 212, 214, 216, 218, and 220. Registers 212-220 are clocked by clock signal 182. Control N_1, control N_2, Data_In_N, AddL_N, and AddH_N are provided to inputs of registers 212, 214, 216, 218, and 220, respectively.

In one aspect, AddH_N may be configured to be chained with other AddH_N ports or sub-ports, as the case may be, in other instances of memory circuit 100 to form a cascade. The cascade may be pipelined every several instances of memory circuit 100. In that case, a single word for AddH_N may flow from the head of the chain of memory circuits through all memory circuits along the chain. For each memory circuit of the chain having the Nth port programmed to match this word, the Nth port of that memory circuit is enabled for operation.

Control N_1 and control N_2 each may be implemented as single bit signals. Accordingly, registers 212 and 214 may be implemented as single bit registers. In one aspect, control N_1 may be a read enable signal, while control N_2 may be a write enable signal. In another aspect, control N_2 may be a port enable signal, while control N_2 is a read-write select signal. In that case, control N_2 indicates whether a read or a write operation is to be performed when control N_1 indicates that port 120 is enabled.

Data_In_N may be a 72 bit data signal. Accordingly, register 216 may be 72 bits in width or implemented as 72 single bit registers. AddL_N may be a 12 bit address signal. Accordingly, register 218 may be 12 bits in width or implemented as 12 single bit registers. AddH_N may be an 11 bit address signal. Accordingly, register 220 may be 11 bits in width or implemented as 11 single bit registers.

Control 1_1, control 1_2, Data_In_1, and AddL_1, after being registered, propagate through to output stage 122. AddH_1 is provided to decoder 108. Control N_1, control N_2, Data_In_N, and AddL_N, after being registered, propagate through to output port 124. AddH_N is provided to decoder 110.

Decoder 108 includes an exclusive-NOR gate 235, an OR gate 240, and a NAND gate 245. Exclusive-NOR gate 235 receives the signal output from register 210, which is eleven bits, at a first input and an eleven bit signal specifying an identifier for input port 118 called "ID_1" at a second input. Exclusive-NOR gate 235 performs a logical exclusive-NOR operation between the output from register 210 and ID_1, e.g., between the first and second inputs. The result of the exclusive-NOR operation is provided to a first input of OR gate 240 as an eleven bit signal. OR gate 240 receives an eleven bit mask for input port 118 called "IDM_1" at a second input. OR gate 240 performs a logical OR operation between the output from exclusive-NOR gate 235 and IDM_1, e.g., between the first and second inputs. IDM_1 allows a ternary match to be performed with AddH_1 where one of three possible states may be determined. The result of the logical OR operation is provided to NAND gate 245 as an eleven bit signal. NAND gate 245 performs a logical NAND operation on the received eleven bit signal generating enable signal 130 as a single bit signal.

Decoder 110 includes an exclusive-NOR gate 250, an OR gate 255, and a NAND gate 260. Exclusive-NOR gate 250 receives the signal output from register 220, which is eleven bits, at a first input and an eleven bit signal specifying an identifier for input port 120 called "ID_N" at a second input. Exclusive-NOR gate 250 performs a logical exclusive-NOR operation between the output from register 220 and ID_N, e.g., between the first and second inputs. The result of the exclusive-NOR operation is provided to a first input of OR gate 255 as an eleven bit signal. OR gate 255 receives an eleven bit mask for input port 120 called "IDM_N" at a second input. OR gate 255 performs a logical OR operation between the output from exclusive-NOR gate 250 and IDM_N, e.g., between the first and second inputs. IDM_N allows a ternary match to be performed with AddH_N, where one of three possible states may be determined. The result of the logical OR operation is provided to NAND gate 260 as an eleven bit signal. NAND gate 260 performs a logical NAND operation on the received eleven bit signal generating enable signal 132 as a single bit signal.

In one aspect, an IC may include a particular number of instances M of memory circuit 100. An IC, for example, may include hundreds or thousands of instances of memory circuit 100. In one particular example, the number of instances M may be 1,680. The IC, therefore includes N×M input ports for the M memory circuits 100. As an example, consider a case where 16 logical memories are formed using the 1,680 instances of memory circuit 100. Each logical memory includes 105 physical instances of memory circuit 100. In this example, if, and only if, the high address ports (e.g., AddH_1, AddH_N) all see the same input and the ternary IDM_1*s* and IDM_Ns are unique for each of the 16 logical memories, on each clock cycle, at most one memory circuit of a logical memory is read and at most one memory circuit of the logical memory is written.

While one may allow all memory ports to remain active, this causes increased power consumption in the IC. Enable signals 130 and 132 allow one, both, or neither of input ports 126 and 128 of N:1 mux 112 to be activated according to the state of enable signals 130 and 132, respectively. It should be appreciated, however, that it is possible to program the IDs and the IDMs so that given the same high address, more than one memory circuit has the corresponding port activated.

In one aspect, ID_1, IDM_1, ID_N, and IDM_N may be implemented as configuration memory cells. In that case, a configuration bitstream loaded into the IC including memory circuit(s) 100 includes the values to be stored in the memory cells implementing ID_1, IDM_1, ID_N, and IDM_N.

Decoders 108 and 110 within each instance of memory circuit 100 may be connected to a global address bus directly, e.g., a hardwired global address bus, that provides the various input signals pictured in FIG. 2 to each of input ports 118 and 120. The global address bus allows the decoders of each memory circuit 100 instance to be connected without using programmable circuitry or programmable interconnects of the IC. Decoders 108 and 110 in each memory circuit 100 instance enable the corresponding input port of N:1 mux 112 by comparing the received global address specified by ADDH_1 and ADDH_N for each memory circuit 100, with ID_1 and ID_N, respectively. The result of the comparison is masked using IDM_1 and IDM_N, respectively. The mask bits specified by IDM_1 and IDM_N determine which bits in the comparison are "do not care bits," thereby implementing the ternary comparison. A logic 1 bit in the mask, for example, may indicate a do not care (e.g., a "don't care" bit) in the corresponding bit position in AddH_1 or in AddH_N that is received.

AddL_1 and AddL_N specify the local address that is used to perform the memory operation within RAM matrix 114 of the memory circuit. The local address specified by AddL_1 or AddL_N, as the case may be, indicates the address in RAM matrix 114 that is read or written depending upon the particular memory operation being performed. For a read operation to be performed by port 1 or N, for example, the port must be enabled by enable signal 130 or 132, as the case may be. Further, the corresponding control signals must be asserted. For example, the read enable should be asserted or the port enable asserted in combination with the read select. Similarly, for a write operation to be performed by port 1 or N, the port must be enabled by enable signal 130 or 132, as the case may be. Further, the appropriate control signals for the port must be asserted. For example, the write enable should be asserted or the port enable asserted in combination with the write select.

Figure 3:
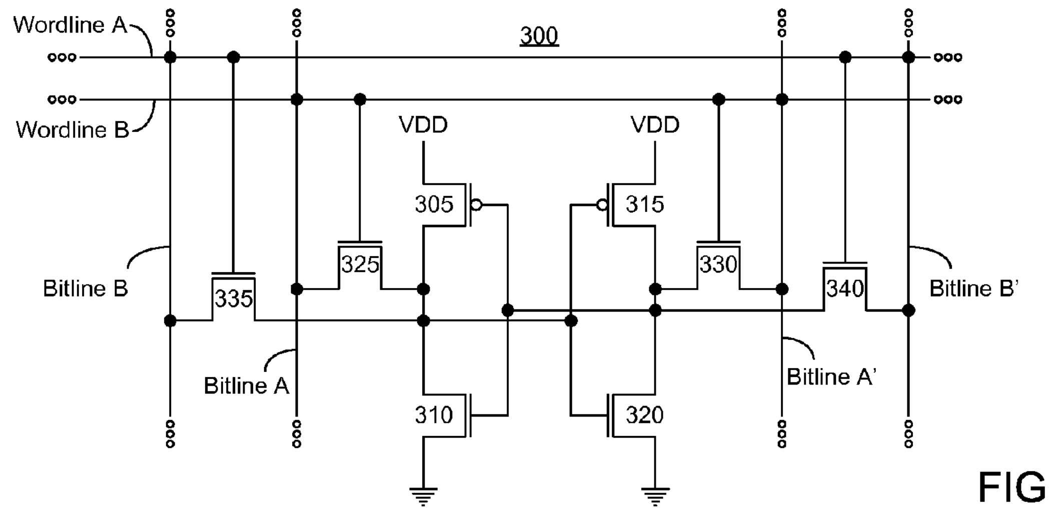
FIG. 3 is a circuit diagram illustrating an exemplary memory cell.

FIG. 3 is a circuit diagram illustrating an exemplary memory cell 300.

Memory cell 300 is an example of an eight (8) transistor memory cell. Memory cell 300 further is an example of a static random access memory (SRAM) memory cell. Memory cell 300 may be replicated to create RAM matrix 114. As pictured, memory cell 300 includes differential read or write ports.

As pictured, memory cell 300 includes transistors 305, 310, 315, 320, 325, 330, 335, and 340. Transistors 305 and 315 are implemented as P-type transistors. Transistors 310, 320, 325, 330, 335, and 340 are implemented as N-type transistors. In general, memory cell 300 includes a first inverter including transistors 305 and 310 and a second inverter including transistors 315 and 320. The two inverters are cross-coupled to store a single bit, e.g., a zero or a one.

Transistors 325, 330, 335, and 340 are access transistors that control access to transistors 305, 310, 315, and 320 during a read operation and/or a write operation. The gates of transistors 335 and 340 are coupled to wordline A as pictured. The gates of transistors 325 and 330 are coupled to wordline B as pictured. Transistor 335 is coupled to bitline B. Transistor 340 is coupled to bitline B' (i.e., bitline B bar). Transistor 325 is coupled to bitline A. Transistor 330 is coupled to bitline A' (i.e., bitline A bar).

Referring to the first inverter, the gate of transistor 305 is coupled to the gate of transistor 310. The gates of transistors 305 and 310 are also coupled to the drain of transistor 340. The drain of transistor 305 is coupled to the drain of transistor 310. The drains of transistors 305 and 310 are coupled to the drain of transistors 325 and 335 and to the gates of transistors 315 and 320. The source of transistor 305 is coupled to VDD. The source of transistor 310 is coupled to ground.

Referring to the second inverter, the gate of transistor 315 is coupled to the gate of transistor 320. The gates of transistors 315 and 320 are also coupled to the drain of transistor 335. The drain of transistor 315 is coupled to the drain of transistor 320. The drains of transistors 315 and 320 are coupled to the drain of transistors 330 and 350 and to the gates of transistors 305 and 310. The source of transistor 315 is coupled to VDD. The source of transistor 320 is coupled to ground.

It should be appreciated that FIG. 3 is provided for purposes of illustration and not limitation. One or more other memory cell architectures may be used that include additional transistors. Further, the type of transistor illustrated in FIG. 3 is provided for purposes of illustration and not limitation. Other transistor types may be used depending upon the particular IC fabrication technology being used.

Figure 4:
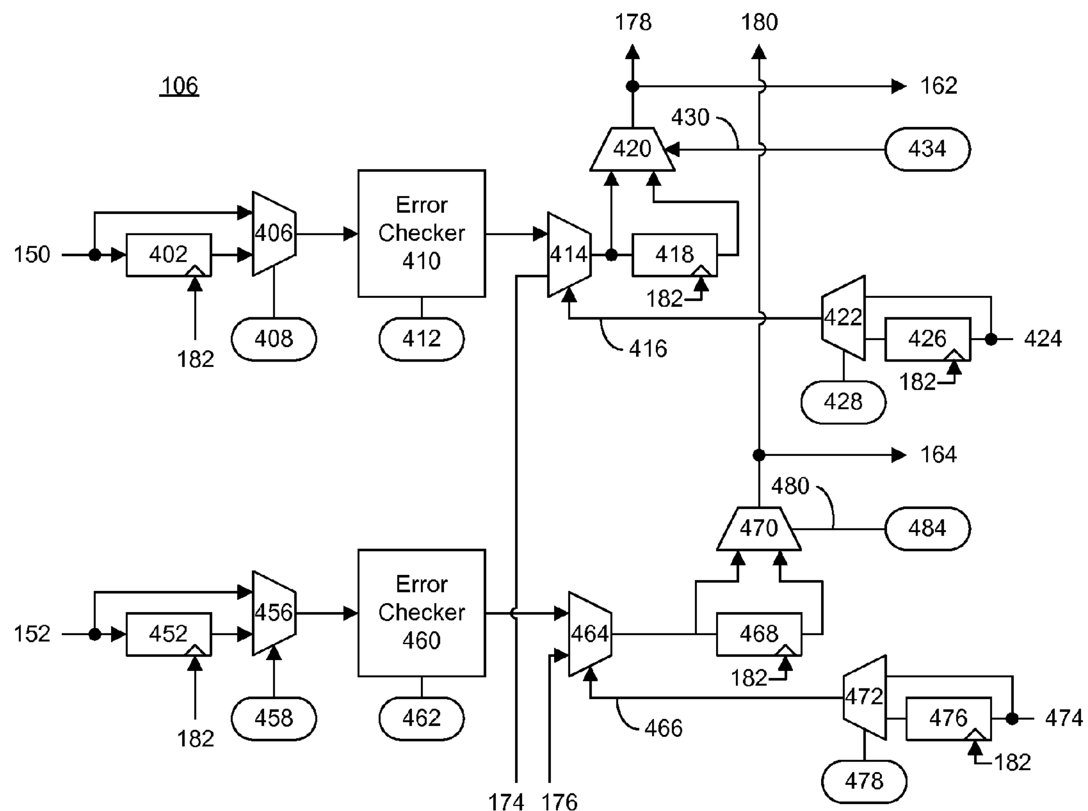
FIG. 4 is a block diagram illustrating an exemplary implementation of output stage for the memory circuit of FIG. 1.

FIG. 4 is a block diagram illustrating an exemplary implementation of output stage 106 of the memory circuit of FIG. 1. As pictured, output stage 106 receives signals 150 and 152 as input signals. Input signal 150 is provided to an input of register 402, which is clocked by clock signal 182. Multiplexer 406 receives signal 150, unregistered, at a first input and a registered version of signal 150 from an output of register 402. Multiplexer 406 passes either the unregistered version of signal 150 or the registered version of signal 150 as an output to error checker 410 based upon the value stored in memory cell 408 that is provided to multiplexer 406 as a select signal. In one aspect, memory cell 408 may be a configuration memory cell.

Error checker 410 may be enabled or disabled based upon the value stored in memory cell 412 and provided to error checker 410. Memory cell 412 may be a configuration memory cell. In one aspect, error checker 410, when in a disabled mode, may operate in a bypass mode that allows the input signals to pass through to the output unchanged.

Multiplexer 414 receives an output from error checker 410 at a first input and cascade input signal 174 at a second input. Multiplexer 414 passes either the output from error checker 410 or cascade input signal 174 according to select signal 416. Multiplexer 414 passes either the output from error checker 410 or cascade input signal 174 as an output signal to register 418 and to a first input of multiplexer 420. Register 418, which is clocked by clock signal 182, outputs a registered version of the output of multiplexer 414 to a second input of multiplexer 420.

Select signal 416 is generated by multiplexer 422. As shown, multiplexer 422 receives a first input signal from signal 424 at a first input and a registered version of signal 424, as processed through register 426, at a second input. In one aspect, signal 424 may be derived from the read enable signal from the input side of the memory circuit and delayed appropriately to match the pipeline delay from the input port through the SRAM matrix. Register 426 is clocked by clock signal 182. Multiplexer 422 passes the signal from the first or second input according to the value stored in memory cell 428. In one aspect, memory cell 428 may be implemented as a configuration memory cell. Multiplexer 420 passes the signal at the first input or the second input according to select signal 430. Select signal 430 is provided by memory cell 434. In one aspect, memory cell 434 may be a configuration memory cell.

As pictured, multiplexer 420 generates cascade output signal 178 and output signal 162. Cascade output signal 178 may be provided to one or more other memory cells as a cascade input signal (e.g., cascade input signal 174). Output signal 162 may be provided to circuitry implemented within the programmable circuitry of the IC.

Input signal 152 is provided to an input of register 452, which is clocked by clock signal 182. Multiplexer 456 receives signal 152, unregistered, at a first input and a registered version of signal 152 from an output of register 452. Multiplexer 456 passes either the unregistered version of signal 152 or the registered version of signal 152 as an output to error checker 460 based upon the value stored in memory cell 458 that is provided to multiplexer 456 as a select signal. In one aspect, memory cell 458 may be a configuration memory cell.

Error checker 460 may be enabled or disabled based upon the value stored in memory cell 462 and provided to error checker 460. Memory cell 462 may be a configuration memory cell. In one aspect, error checker 460, when in a disabled mode, may operate in a bypass mode that allows the input signals to pass through to the output unchanged.

Multiplexer 464 receives an output from error checker 460 at a first input and cascade input signal 176 at a second input. Multiplexer 464 passes either the output from error checker 460 or cascade input signal 176 according to select signal 466. Multiplexer 464 passes either the output from error checker 460 or cascade input signal 176 as an output signal to register 468 and to a first input of multiplexer 470. Register 468, which is clocked by clock signal 182, outputs a registered version of the output of multiplexer 464 to a second input of multiplexer 470.

Select signal 466 is generated by multiplexer 472. As shown, multiplexer 472 receives a first input signal as signal 474 at a first input and a registered version of signal 474, as processed through register 476, at a second input. In one aspect, signal 474 may be derived from the read enable signal from the input side of the memory circuit and delayed appropriately to match the pipeline delay from the input port through the SRAM matrix. Register 476 is clocked by clock signal 182. Multiplexer 472 passes the signal from the first or second input according to the value stored in memory cell 478 that is provided to multiplexer 472 as a select signal. In one aspect, memory cell 478 may be implemented as a configuration memory cell.

Multiplexer 470 passes the signal at the first input or the second input according to select signal 480. Select signal 480 is provided by memory cell 484. In one aspect, memory cell 484 may be a configuration memory cell. As pictured, multiplexer 470 generates cascade output signal 180 and output signal 164. Cascade output signal 180 may be provided to one or more other memory cells as a cascade input signal (e.g., cascade input signal 176). Output signal 164 may be provided to circuitry implemented within the programmable circuitry of the IC.

Figure 5:
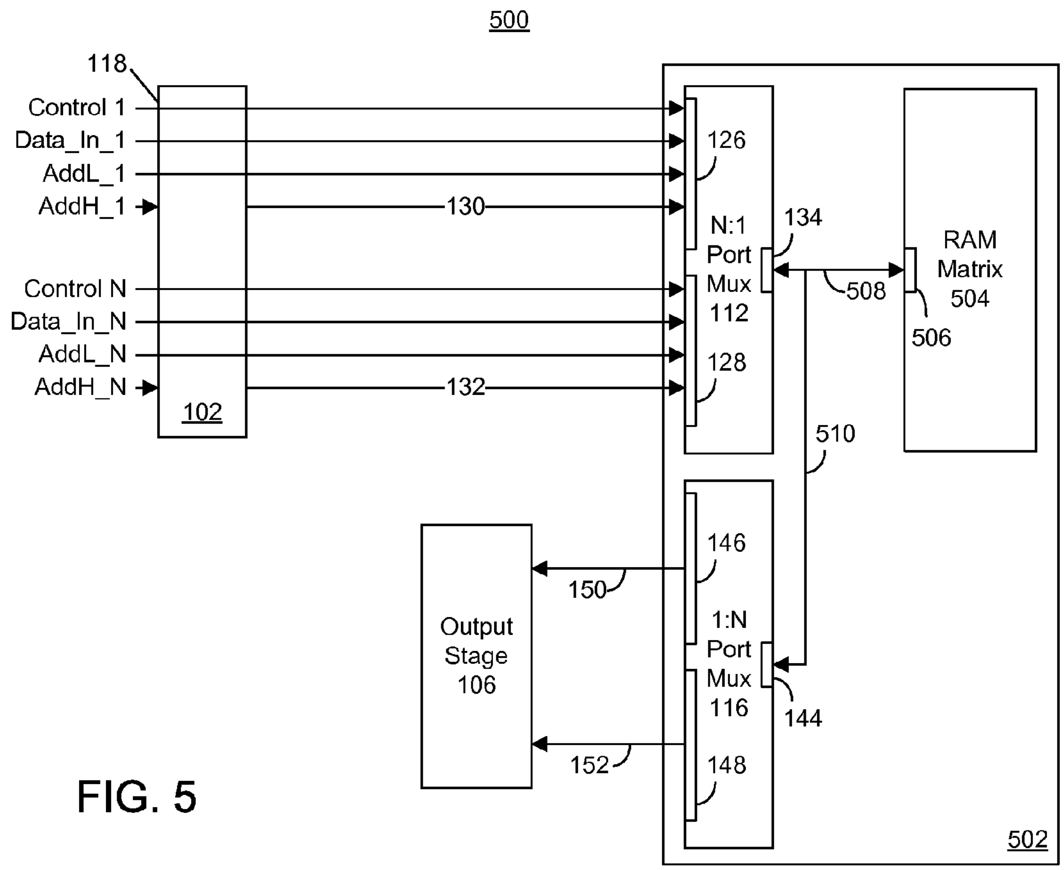
FIG. 5 is a block diagram illustrating another exemplary memory circuit.

FIG. 5 is a block diagram illustrating another exemplary memory circuit 500. As pictured, memory circuit 500 includes an input stage 102, a memory core 502, and an output stage 106. For purposes of illustration, input stage 102 and output stage 106 may be implemented substantially as described with reference to FIGS. 1, 2, and 4 herein. In this regard, particular aspects of both input stage 102 and output stage 106 are not shown. For example, port indicators and decoders are not illustrated in FIG. 5.

Memory core 502 includes an N:1 port mux 112 having input ports 126 and 128, and an output port 134 substantially as described with reference to FIG. 1. Memory core 502 includes a 1:N port mux 116 having an input port 144 and output ports 146 and 148 substantially as described with reference to FIG. 1. For purposes of illustration, the various controls signals are collectively illustrated as control 1 and control N for each of the ports shown.

RAM matrix 504 includes a single port 506 that receives signal 508 from port 134 of N:1 port mux 112. Signal 508 is a multi-bit signal including control signal(s) and data signals. The control signals may be implemented as an enable signal and a read-write select signal. Port 506, for example, may operate as a read port or a write port depending upon the state of the read-write select control signal. In this regard, the control signals may be unidirectional and flow from N:1 mux port 112 to RAM matrix 504. The data signals may be bidirectional. In one aspect, separate data signals may be provided in the form of unidirectional data signals from N:1 port mux 112 providing data for a write operation and unidirectional data signals, shown as signals 510, from RAM matrix 504 to 1:N port mux 116 carrying data from a read operation. While the data may be carried by separate wires as described, RAM matrix 504 is described as having a single port since the data signals in each direction share the same control signals.

Figure 6:
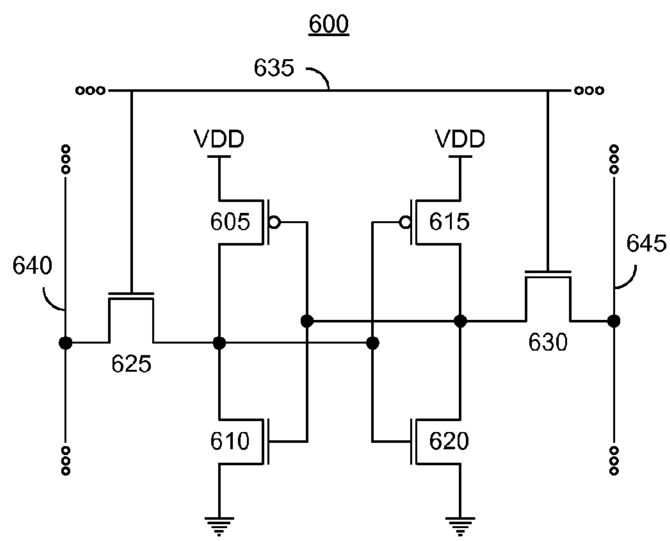
FIG. 6 is a circuit diagram illustrating another exemplary memory cell.

FIG. 6 is a circuit diagram illustrating another exemplary memory cell 600. Memory cell 600 is an example of a six (6) transistor memory cell. Memory cell 600 further is an example of an SRAM memory cell. Memory cell 600 may be replicated to create RAM matrix 504. As pictured, memory cell 600 includes a single port configurable for read or write operations.

As pictured, memory cell 300 includes transistors 605, 610, 615, 620, 625, and 630. Transistors 605 and 615 are implemented as P-type transistors. Transistors 610, 620, 625, and 630 are implemented as N-type transistors. In general, memory cell 600 includes a first inverter including transistors 605 and 610 and a second inverter including transistors 615 and 620. The two inverters are cross-coupled to store a single bit, e.g., a zero or a one. Transistors 625 and 630 are access transistors that control access to transistors 605, 610, 615, and 620 during a read operation and/or a write operation.

Referring to the first inverter, the gate of transistor 605 is coupled to the gate of transistor 610. The gates of transistors 605 and 610 are also coupled to the drain of transistor 630. The drain of transistor 605 is coupled to the drain of transistor 610. The drains of transistors 605 and 610 are coupled to the drain of transistor 625 and the gates of transistors 615 and 620. The source of transistor 605 is coupled to VDD. The source of transistor 610 is coupled to ground. The gate of transistor 625 is coupled to word line 635. The source of transistor 625 is coupled to bit line 640.

Referring to the second inverter, the gate of transistor 615 is coupled to the gate of transistor 620. The gates of transistors 615 and 620 are also coupled to the drain of transistor 625. The drain of transistor 615 is coupled to the drain of transistor 620. The drains of transistors 615 and 620 are coupled to the drain of transistor 630 and the gates of transistors 605 and 610. The source of transistor 615 is coupled to VDD. The source of transistor 620 is coupled to ground. The gate of transistor 630 is coupled to word line 635. The source of transistor 630 is coupled to bit line 645.

It should be appreciated that FIG. 6 is provided for purposes of illustration and not limitation. One or more other memory cell architectures may be used that include additional transistors. Further, the type of transistor illustrated in FIG. 6 is provided for purposes of illustration and not limitation. Other transistor types may be used depending upon the particular IC fabrication technology being used.

Figure 7:
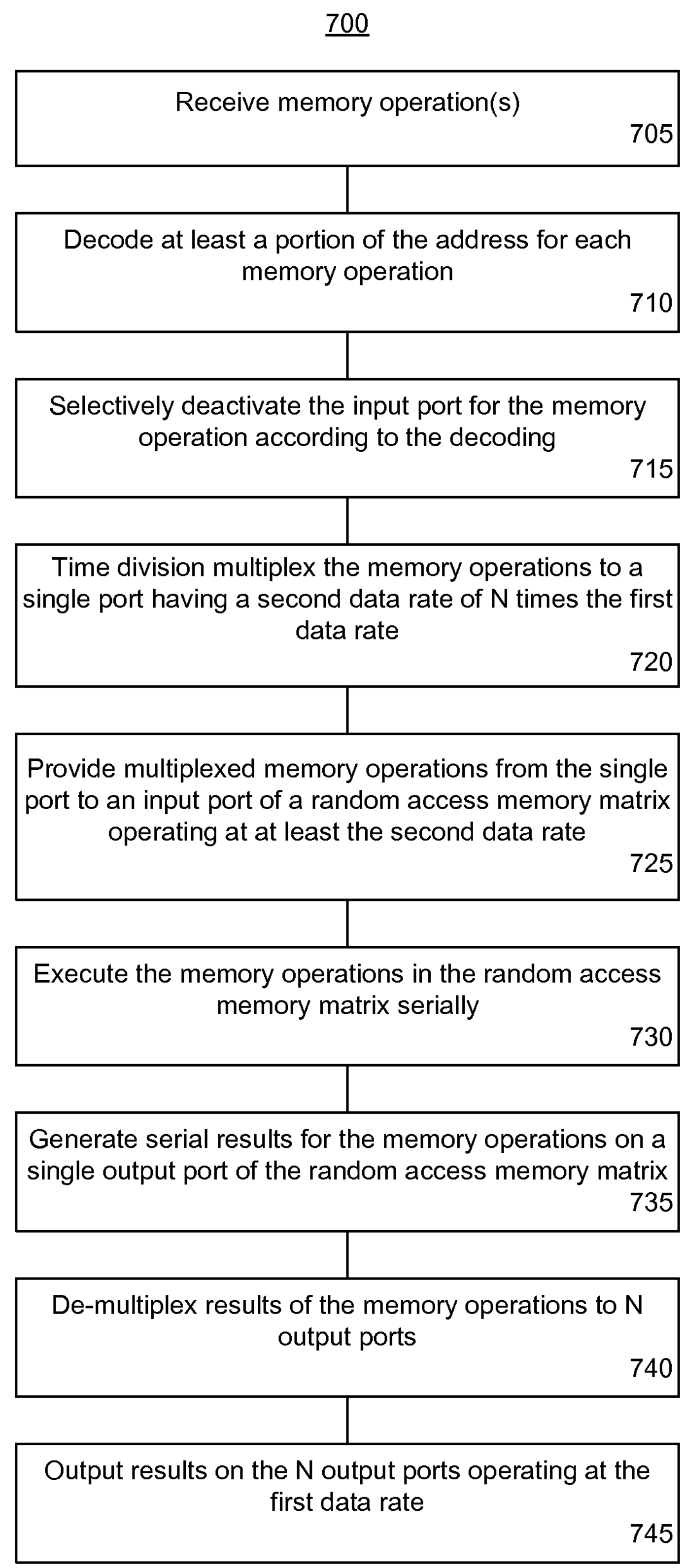
FIG. 7 is a flow chart illustrating an exemplary method of operation for a memory circuit.

FIG. 7 is a flow chart illustrating an exemplary method 700 of operation for a memory circuit. The memory circuit may be implemented as described herein with reference to FIGS. 1-6 of this disclosure. Method 700 may begin in a state where the memory circuit is operational within an IC that includes circuitry accessing the memory circuit.

In block 705, the memory circuit receives memory operations. For example, the memory circuit may receive memory operations on one or more or all of the N input ports of the input stage. Memory operations received on the N input ports of the input stage may be received concurrently, e.g., at a same clock edge. The memory operations are received at a first data rate at which each input port of the input stage operates.

In block 710, the input stage decodes at least a portion of the address for each memory operation. The input stage may decode the portion of the address for each memory operation that is received on each of the N input ports. In block 715, the input stage may selectively deactivate the input port for a memory operation according to the decoding.

For example, as discussed, each input port of the input stage is coupled to a decoder. The decoder may compare the portion of the address for each memory operation provided to the decoder with a port identifier. The port identifier may be port-specific across a plurality of different memory structures. The input stage, for example, may deactivate each of the N input ports responsive to a mismatch between the port identifier and the portion of the address being decoded. More particularly, the input stage may deactivate a corresponding in input port for the memory core responsive to a mismatch determined by the decoding.

In one aspect, the decoder may apply a mask to a result of the comparison. The mask may also be port-specific across the plurality of memory structures. The decoder for each input port, for example, may generate an enable signal from the masked result that is provided to a corresponding one of the N input ports of the memory core. The input port of the memory core is activated or deactivated based upon the enable signal for the port. When deactivated the input port of the memory core is prevented from transitioning.

In block 720, the memory core and, in particular, the N:1 mux, time division multiplexes the memory operations to a single port having a second data rate of at least N times the first data rate. In block 725, the N:1 mux provides the multiplexed memory operations to the RAM matrix. The RAM matrix operates at at least the second data rate.

In block 730, the RAM matrix executes the memory operations serially. Consider the case where N=2. The RAM matrix may process a first memory operation, e.g., the memory operation received at the first port of the input stage, responsive to a rising clock edge of a clock. In one aspect, the RAM matrix may process a second memory operation, e.g., the memory operation received at the second port of the input stage, responsive to a falling edge of the clock. In this example, the RAM matrix has a data rate that is N times, or twice, that of the first data rate, i.e., the data rate of a single port of the input stage. Using the falling edge of the clock, however, renders RAM matrix susceptible to clock skew.

In another aspect, responsive to completing execution of the first memory operation, the second memory operation may be executed. The second memory operation may be executed immediately upon completion of the first memory operation, thereby providing the RAM matrix with a data rate that is at least N times the first data rate. It should be appreciated that while the memory operations are referred to as the first and the second, the respective memory operations may have been received by the input stage of the memory circuit concurrently or at the same time.

In block 735, the RAM matrix generates, or outputs, serial results of the memory operations. In block 740, the 1:N mux de-multiplexes the results of the memory operations to N output ports. In block 745, the results are output on the N output ports of the output stage. As discussed, the results may also be output on the cascade output ports of the output stage. In still another aspect, one or more signals received on the cascade inputs of the output stage may be output on one or more of the N output ports of the output stage in lieu of the results. The results may or may not be registered as illustrated in FIG. 4.

Figure 8:
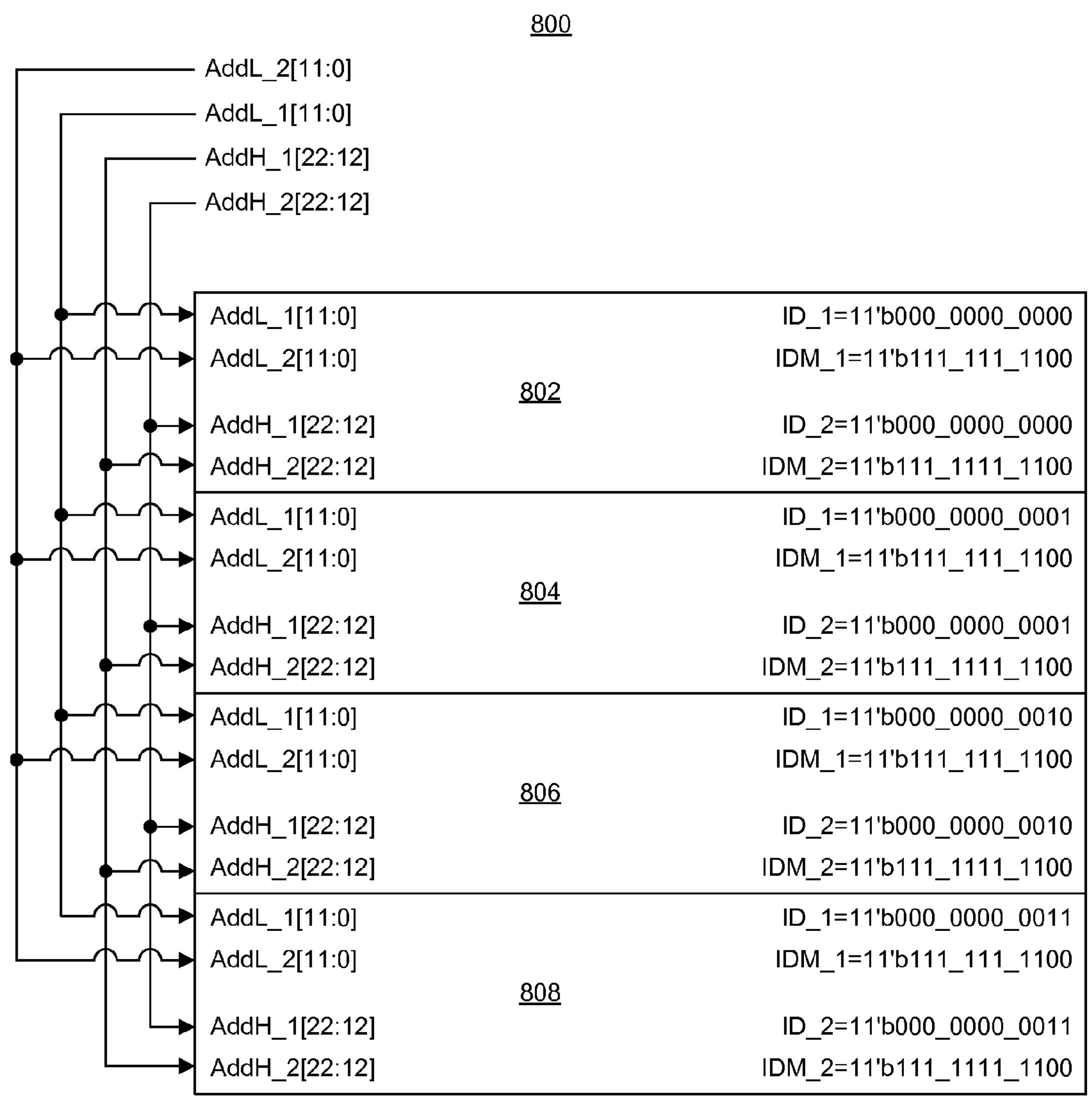
FIG. 8 is a block diagram illustrating an exemplary memory structure including a plurality of memory circuits.

FIG. 8 is a block diagram illustrating an exemplary memory structure 800 including a plurality of memory circuits 802, 804, 806, and 808. Memory circuits 802-808 may be implemented as described herein with reference to FIGS. 1-7. Memory structure 800 represents a logical 16K×72 one read, one write (1R1W) memory.

The AddL_N signal for each port of each of memory circuits 802, 804, 806, and 808 is 12 bits wide and specifies the local address to be used for the memory circuit for performing a given memory operation. As noted, memory circuits 802, 804, 806, and 808 each may be coupled to a common, hardwired bus carrying the address, data, and/or control signals illustrated within this disclosure. Thus, the available address bits for each of ports 1 and 2 (e.g., AddL_1, AddH_1, AddL_2, and AddH_2) connect directly to each of the input ports of memory circuits 802, 804, 806, and 808 without any decoder being needed or included in the programmable circuitry of the IC in which memory structure 800 is implemented. The AddH_N signal in this example is 11 bits wide, though only 2 bits are needed to specify one of memory circuits 802, 804, 806, or 808. Thus, a total of 14 address bits for each of ports 1 and 2 is used.

The port identifiers (ID_N) in this example are configured through the configuration bitstream loaded into the IC as 0, 1, 2, and 3 for memory circuits 802, 804, 806, and 808, respectively. Because only the two least-significant bits are used in the decoding logic, only the lowest two bits of the mask for each port (IDM_N) are set to 0. ID_1 and ID_2 in the same memory circuit do not have to be the same.

Referring to memory circuit 802, port 1 is enabled if and only if AddH_1[13:12]==2'b00. Similarly, port 2 is enabled if and only if AddH_2[13:12]==2'b00. Referring to memory circuit 804, port 1 is enabled if and only if AddH_1[13:12]==2'b01. Port 2 is enabled if and only if AddH_2[13:12]==2'b01. Referring to memory circuit 806, port 1 is enabled if and only if AddH_1[13:12]==2'b10. Port 2 is enabled if and only if AddH_2[13:12]=2'b10. Referring to memory circuit 808, port 1 is enabled if and only if AddH_1[13:12]==2'b11. Port 2 is enabled if and only if AddH_2=2'b11. FIG. 8 presents one of many different examples of how one may set ID_N and IDM_N for a given port to form a larger, logical memory structure.

Figure 9:
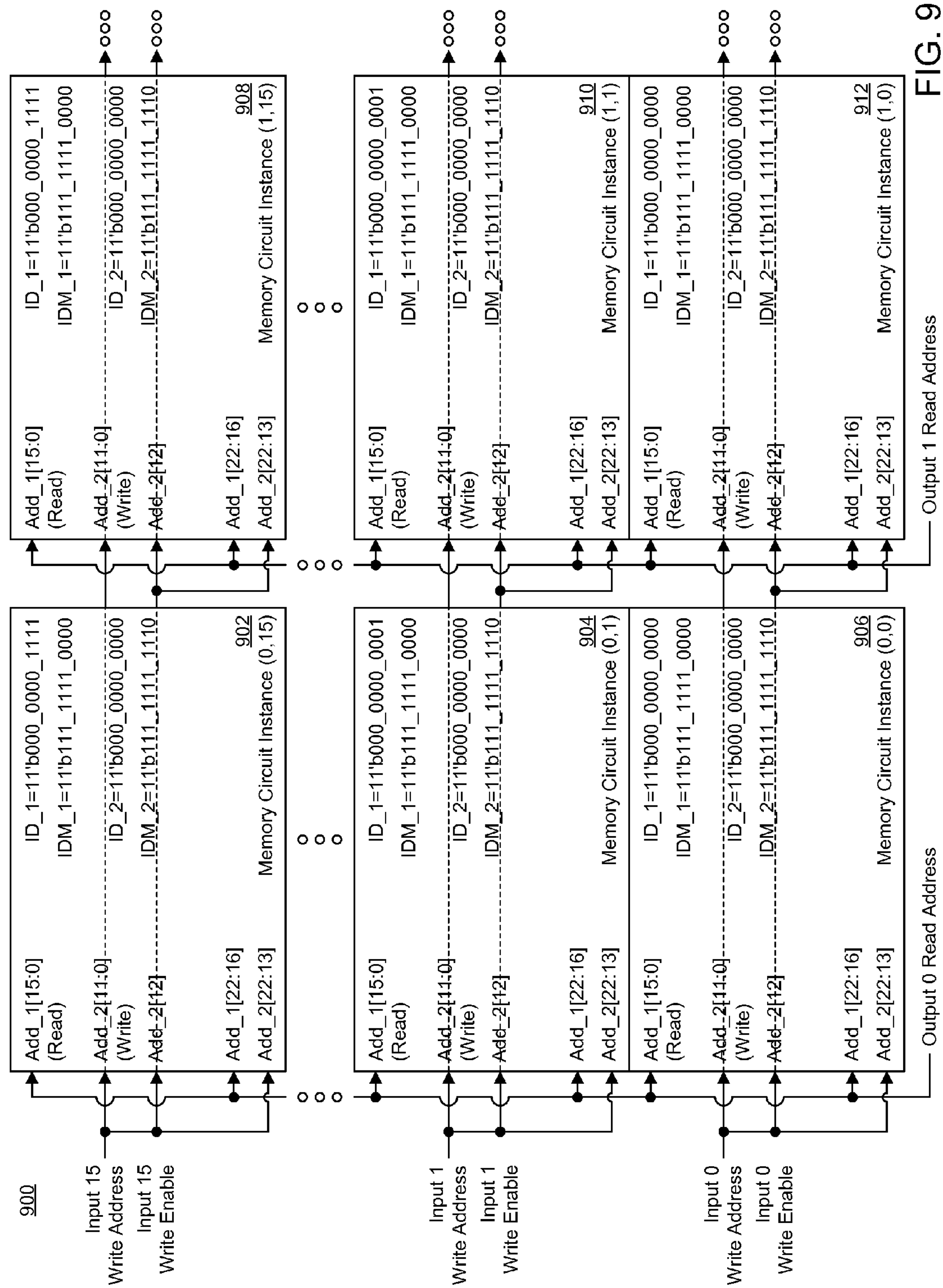
FIG. 9 is a block diagram illustrating another exemplary memory structure including a plurality of memory circuits.

FIG. 9 is a block diagram illustrating another exemplary memory structure 900 including a plurality of memory circuits. Memory structure 900 illustrates a 16×16 memory switch. For clarity, only the read and write addresses are shown and selected control signals. The data input and output busses are not illustrated. Further, for purposes of clarity, only memory circuits 902, 904, 906, 908, 910, and 912 are illustrated.

Memory structure 900 is organized as a 16×16 matrix, where 16 copies of a 16×1 switch are stored. The 16×1 switch includes a single column of 16 rows of memory circuits. Each row of memory circuits receives data from one particular input. The output is taken from one of the 16 memory circuits. Memory structure 900 includes 16 of the aforementioned column switches combined. Each one of the 16 inputs broadcasts its data to 16 memories across one unique row in the matrix. Each output selects one of out of the 16 rows in one unique 16×1 column switch.

In FIG. 9, port 2 is used as a write port and port 1 is used as a read port. All 4K entries are accessible by both ports 1 and 2. Write operations are controlled by Add_2[12] of each memory circuit, which is a higher-order write address bit that is unmasked by IDM_2 being 11'b111_1111_1110. When this bit, i.e., bit 12, is one, the corresponding write port is active. When bit 12 is zero, the corresponding write port is disabled to save power and to reduce noise. Four high-order bits are added to the 12 read address bits to form Add_1[15:0] in each memory circuit. Due to the borrowing of four bits from AddH_N and adding of the four bits to AddrL, the "H" and the "L" symbols are not used in FIG. 9. Instead, the bit notation is used. The four bits select one out of 16 memory circuits in a 16×1 column switch. The global address decoder embedded in port 1 of each memory circuit is unmasked only for the lowest four bits, i.e. IDM_1=11'b111_1111_0000. For each memory circuit, when, and only when, the global address matches the lowest four bits of ID_1, the read port, i.e., port 1, is activated. In any clock cycle, at most 16 out of 256 memory circuit read ports are activated.

Figure 10:
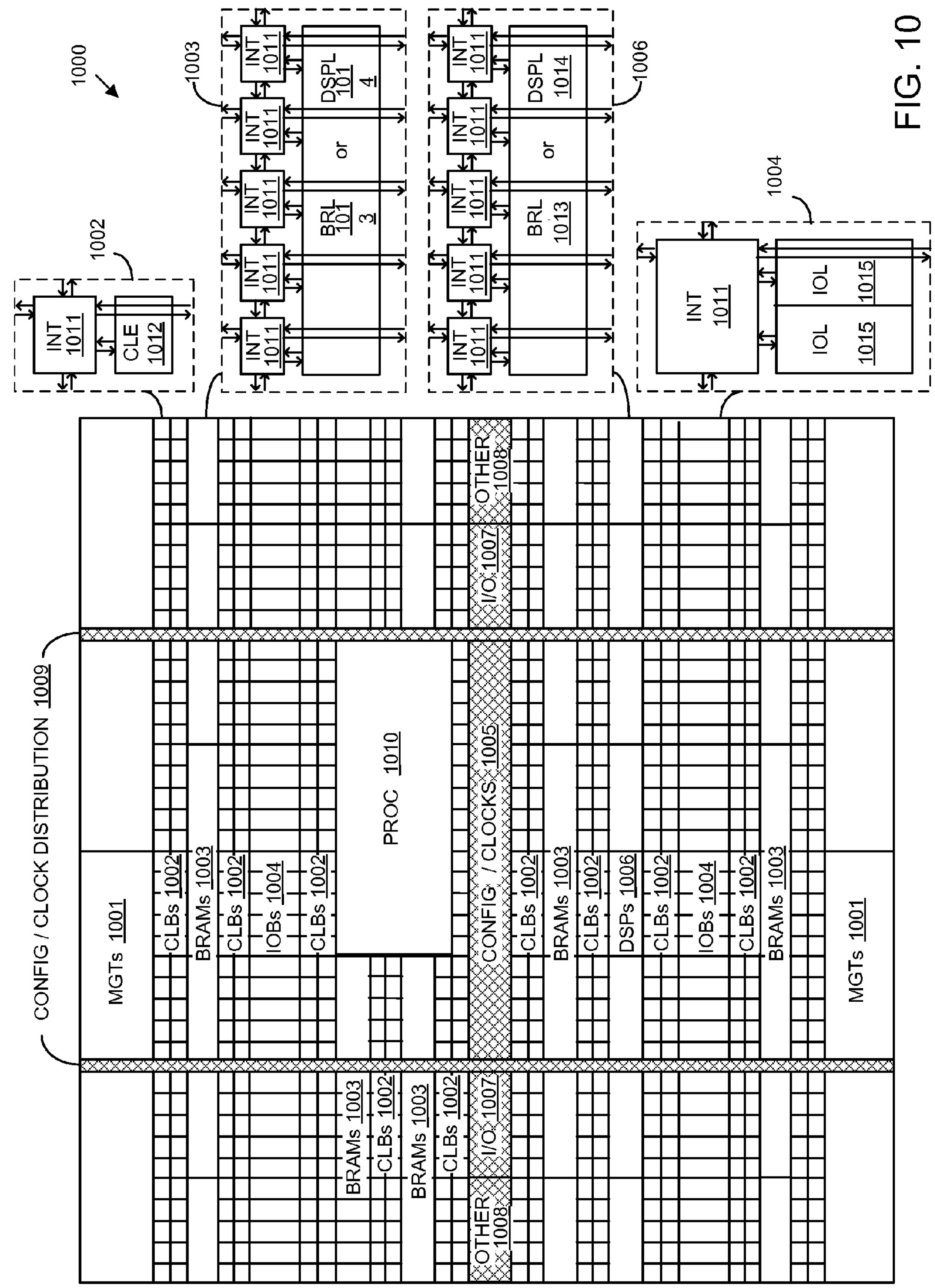
FIG. 10 is a block diagram illustrating an exemplary architecture for an IC.

FIG. 10 is a block diagram illustrating an exemplary architecture 1000 for an IC. For example, architecture 1000 may be used to implement a programmable IC including the memory circuits and/or memory structures described herein. In one aspect, architecture 1000 may be implemented within a field programmable gate array (FPGA) type of IC. Architecture 1000 is also representative of an SOC type of IC. As noted, an SOC is an IC that includes a processor that executes program code and one or more other circuits and/or circuit systems. The circuits and/or circuit systems may operate cooperatively with one another and with the processor.

As shown, architecture 1000 includes several different types of programmable circuit, e.g., logic, blocks. For example, architecture 1000 may include a large number of different programmable tiles including multi-gigabit transceivers (MGTs) 1001, configurable logic blocks (CLBs) 1002, random access memory blocks (BRAMs) 1003, input/output blocks (IOBs) 1004, configuration and clocking logic (CONFIG/CLOCKS) 1005, digital signal processing blocks (DSPs) 1006, specialized I/O blocks 1007 (e.g., configuration ports and clock ports), and other programmable logic 1008 such as digital clock managers, analog-to-digital converters, system monitoring logic, and so forth.

In some ICs, each programmable tile includes a programmable interconnect element (INT) 1011 having standardized connections to and from a corresponding INT 1011 in each adjacent tile. Therefore, INTs 1011, taken together, implement the programmable interconnect structure for the illustrated IC. Each INT 1011 also includes the connections to and from the programmable logic element within the same tile, as shown by the examples included at the top of FIG. 10.

For example, a CLB 1002 can include a configurable logic element (CLE) 1012 that may be programmed to implement user logic plus a single INT 1011. A BRAM 1003 may include a BRAM logic element (BRL) 1013 in addition to one or more INTs 1011. Typically, the number of INTs 1011 included in a tile depends on the height of the tile. As pictured, a BRAM tile has the same height as five CLBs, but other numbers (e.g., four) may also be used. A DSP tile 1006 may include a DSP logic element (DSPL) 1014 in addition to an appropriate number of INTs 1011. An IOB 1004 may include, for example, two instances of an I/O logic element (IOL) 1015 in addition to one instance of an INT 1011. As will be clear to those of skill in the art, the actual I/O pads connected, for example, to IOL 1015 typically are not confined to the area of IOL 1015.

In the example pictured in FIG. 10, a columnar area near the center of the die, e.g., formed of regions 1005, 1007, and 1008, may be used for configuration, clock, and other control logic. Horizontal areas 1009 extending from this column are used to distribute the clocks and configuration signals across the breadth of the programmable IC.

Some ICs utilizing the architecture illustrated in FIG. 10 include additional logic blocks that disrupt the regular columnar structure making up a large part of the IC. The additional logic blocks may be programmable blocks and/or dedicated circuitry. For example, a processor block depicted as PROC 1010 spans several columns of CLBs and BRAMs.

In one aspect, PROC 1010 is implemented as a dedicated circuitry, e.g., as a hard-wired processor, that is fabricated as part of the die that implements the programmable circuitry of the IC. PROC 1010 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1010 is omitted from architecture 1000 and replaced with one or more of the other varieties of the programmable blocks described. Further, such blocks may be utilized to form a "soft processor" in that the various blocks of programmable circuitry may be used to form a processor that executes program code as is the case with PROC 1010.

The phrase "programmable circuitry" means programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 10 that are external to PROC 1010 such as CLBs 1002 and BRAMs 1003 are considered programmable circuitry of the IC. Programmable circuitry may be configured or programmed to implement different physical circuits therein.

In general, the functionality of programmable circuitry is not established until configuration data is loaded into the IC. A set of configuration bits may be used to program programmable circuitry of an IC such as an FPGA. The configuration bit(s) are typically referred to as a "configuration bitstream." In general, programmable circuitry is not operational or functional without first loading a configuration bitstream into the IC. The configuration bitstream effectively implements a particular physical circuit within the programmable circuitry. The configuration bitstream or circuit design specifies, for example, functional aspects of the programmable circuit blocks and physical connectivity among the various programmable circuit blocks that is otherwise non-existent.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry has dedicated circuit blocks and interconnects, for example, that are functional without first loading a configuration bitstream into the IC. An example of hardwired circuitry is PROC 1010.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

As an example, one or more of the memory circuit 100 and/or memory circuit 500 described herein may be implemented in place of BRAMs 1003 within architecture 1000. In one aspect, all BRAMs 1003 may be replaced with an instance of memory circuit 100, and/or memory circuit 500. In another aspect, fewer than all BRAMs 1003 may be replaced with an instance of memory circuit 100 and/or memory circuit 500. Memory circuit 100 and memory circuit 500 are hardwired circuit blocks that may be configured through the loading of a configuration bitstream into configuration memory cells (not shown) of architecture 800. Whereas BRAMs 1003 may be coupled using programmable interconnects, e.g., INTs 1011, the various instances of memory circuit 100 and/or memory circuit 500 are hardwired through a common data and address bus as described. The common data and address bus may include the inputs, outputs, cascade inputs, and cascade outputs. In one aspect, however, the outputs of memory circuits 100 and/or memory circuits 500 may be coupled to programmable circuitry, e.g., one or more INTs, so as to allow the results of memory operations to be provided to other circuitry within architecture 800.

FIG. 10 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 10 are purely exemplary. In an actual IC, for example, more than one adjacent column of CLBs may be included wherever the CLBs appear, to facilitate the efficient implementation of a user circuit design. The number of adjacent CLB columns, however, may vary with the overall size of the IC. Further, the size and/or positioning of blocks such as PROC 1010 within the IC are for purposes of illustration only and are not intended as a limitation.

This disclosure provides a high density memory circuit for use within ICs. The memory circuit includes dedicated decoder circuitry that alleviates the need for implementing decoder circuitry outside of the memory circuit itself. The decoder circuitry is hardwired, as is the circuitry coupling multiple instances of the memory circuit within the IC. The inclusion of decoder circuitry within the memory circuit and the hardwired circuitry coupling multiple instances of the memory circuit allows the efficient creation of larger, logical memory structures using multiple memory circuits. The memory circuit utilizes time division multiplexing to reduce the number of internal ports and, as such, the size of the memory circuit. Still, the memory circuit presents circuits external to the memory circuit with N different input and/or output ports, where N is an integer greater than one.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined within this disclosure, the terms "a" and "an" mean one or more than one. The term "plurality," as defined herein, means two or more than two. The term "another," as defined herein, means at least a second or more. The term "coupled," as defined herein, means connected, whether directly without any intervening elements or indirectly with one or more intervening elements, unless otherwise indicated. Two elements may also be coupled mechanically, electrically, or communicatively linked through a communication channel, pathway, network, or system.

The term "and/or" as defined herein means any and all possible combinations of one or more of the associated listed items. The terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. Although the terms "first," "second," etc. may be used herein to describe various elements, these elements should not be limited by these terms, as these terms are only used to distinguish one element from another unless the context indicates otherwise.

As defined herein, the term "if" means "when," "upon," "in response to determining," "in response to detecting," "responsive to determining," or "responsive to detecting," depending on the context. Similarly, the phrase "if it is determined" or the phrase "if [a stated condition or event] is detected," as defined herein, means "upon determining," "in response to determining," "responsive to determining," "upon detecting [the stated condition or event]," "in response to detecting [the stated condition or event]," or "responsive to detecting [the stated condition or event]," depending on the context.

Within this disclosure, the same reference characters are used to refer to terminals, signal lines, wires, and their corresponding signals. In this regard, the terms "signal," "wire," "connection," "terminal," and "pin" may be used interchangeably, from time-to-time, within this disclosure. It also should be appreciated that the terms "signal," "wire," or the like may represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The flowchart and block diagrams in the Figures illustrate the architecture, functionality, and operation of possible implementations of circuits, systems, and/or methods according to various aspects of the inventive arrangements disclosed herein. In this regard, each block in the flowchart or block diagrams may represent operations of a particular element or elements of the circuits and/or systems that implement the specified function(s). It will also be noted that each block of the block diagrams and/or flowchart illustration, and combinations of blocks in the block diagrams and/or flowchart illustration, can be implemented by special purpose hardware-based systems that perform the specified functions or acts.

In one aspect, the blocks in the flow chart illustration may be performed in increasing numeric order corresponding to the numerals in the various blocks. In other aspects, the blocks may be performed in an order that is different, or that varies, from the numerals in the blocks. For example, two or more blocks shown in succession may be executed substantially concurrently. In other cases, two or more blocks may sometimes be executed in the reverse order, depending upon the functionality involved. In still other cases, one or more blocks may be performed in varying order with the results being stored and utilized in subsequent or other blocks that do not immediately follow.

The corresponding structures, materials, acts, and equivalents of all means or step plus function elements in the claims below are intended to include any structure, material, or act for performing the function in combination with other claimed elements as specifically claimed.

A memory circuit includes an input stage having N input ports and N output ports, wherein N is an integer greater than one, and an N:1 port multiplexer coupled to the N output ports of the input stage and configured to time division multiplex the N output ports to one multiplexed port. The memory circuit further includes a RAM matrix coupled to the multiplexed port and a 1:N port multiplexer coupled to the RAM matrix. The 1:N port multiplexer is configured to de-multiplex signals from the RAM matrix into N output ports.

In one aspect, the RAM matrix has a data rate of at least N times a data rate of one of the N input ports of the input stage. In another aspect, the RAM matrix includes memory cells having six transistors. In still another aspect, the RAM matrix includes static random access memory cells.

The input stage may include a plurality of clocked flip-flops.

The input stage may also include address decoder circuitry coupled to the N input ports of the input stage. The address decoder circuitry may be configured to decode a portion of an address for each of the N input ports of the input stage and generate an enable signal for each of the N output ports of the input stage.

The N:1 port multiplexer may include N input ports coupled to the N output ports of the input stage. The N:1 port multiplexer may be configured to receive the enable signal on each of the N input ports of the N:1 port multiplexer and selectively deactivate each of the N input ports of the N:1 port multiplexer according to a state of the enable signal for each respective one of the N input ports of the N:1 port multiplexer.

The address decoder circuitry may include first circuitry configured to compare the portion of the address for at least one of the N input ports of the input stage to a port identifier.

The address decoder circuit also may include second circuitry configured to apply a mask to a result determined by the first circuitry.

The address decoder circuitry further may include third circuitry configured to generate the enable signal as a single bit from a result of the second circuitry.

The 1:N port multiplexer includes N output ports. The memory circuit further includes an output stage having N input ports coupled to the N output ports of the 1:N port multiplexer and N output ports.

The output stage further may include N cascade input ports and N cascade output ports. In one example, the N cascade input ports may be coupled to cascade output ports of a first different memory circuit. In another example, the N cascade output ports may be coupled to cascade input ports of a second different memory circuit.

A method includes receiving memory operations on N input ports, wherein each of the N input ports operates at a first data rate, and time division multiplexing the memory operations to a single port having a second data rate that is at least N times the first data rate. The method also includes providing the multiplexed memory operations from the single port to a RAM matrix, wherein the RAM matrix operates at least at the second data rate. The method further includes implementing the memory operations in the RAM matrix serially.

The method may include generating serial results for the memory operations that are output from the RAM matrix, de-multiplexing the results of the memory operations to N output ports, and outputting the results on the N output ports. Each of the N output ports may operate at the first data rate.

The method may include decoding a portion of an address for each memory operation and selectively deactivating the input port receiving the memory operation according to the decoding.

The method also may include comparing the portion of the address for each memory operation with a port identifier, wherein the port identifier is port-specific across a plurality of memory structures, and deactivating each of the N input ports responsive to a mismatch between the port identifier and the portion of the address.

The method may include applying a mask to a result of the comparison, wherein the mask is port-specific across the plurality of memory structures.

The method also may include generating an enable signal for each of the N input ports from the masked result of the comparison.

The method may include obtaining the port identifier and the mask identifier from configuration memory cells.

The features described within this disclosure may be embodied in other forms without departing from the spirit or essential attributes thereof. Accordingly, reference should be made to the following claims, rather than to the foregoing disclosure, as indicating the scope of such features and implementations.

What is claimed is:

1. A memory circuit, comprising:

an input stage comprising N input ports and N output ports, wherein N is an integer greater than one;

an N:1 port multiplexer coupled to the N output ports of the input stage and configured to time division multiplex the N output ports to one multiplexed port;

a random access memory matrix coupled to the multiplexed port; and a 1:N port multiplexer coupled to the random access memory matrix and comprising N output ports, wherein the 1:N port multiplexer is configured to de-multiplex signals from the random access memory matrix into the N output ports of the 1:N port multiplexer; and wherein the input stage comprises:

address decoder circuitry coupled to the N input ports of the input stage;

wherein the address decoder circuitry is configured to decode a portion of an address for each of the N input ports of the input stage and generate an enable signal for each of the N output ports of the input stage.

2. The memory circuit of claim 1, wherein the random access memory matrix has a data rate of at least N times a data rate of one of the N input ports of the input stage.

3. The memory circuit of claim 2, wherein the random access memory matrix comprises memory cells comprising six transistors.

4. The memory circuit of claim 2, wherein the random access memory matrix comprises static random access memory cells.

5. The memory circuit of claim 1, wherein the input stage comprises:

a plurality of clocked flip-flops.

6. The memory circuit of claim 1, wherein:

the N:1 port multiplexer comprises N input ports coupled to the N output ports of the input stage; and the N:1 port multiplexer is configured to receive the enable signal on each of the N input ports of the N:1 port multiplexer and selectively deactivate each of the N input ports of the N:1 port multiplexer according to a state of the enable signal for each respective one of the N input ports of the N:1 port multiplexer.

7. The memory circuit of claim 1, wherein the address decoder circuitry further comprises:

first circuitry configured to compare the portion of the address for at least one of the N input ports of the input stage to a port identifier.

8. The memory circuit of claim 7, wherein the address decoder circuitry further comprises:

second circuitry configured to apply a mask to a result determined by the first circuitry.

9. The memory circuit of claim 8, wherein the address decoder circuitry further comprises:

third circuitry configured to generate the enable signal as a single bit from a result of the second circuitry.

10. The memory circuit of claim 1, further comprising:

an output stage comprising:

N input ports coupled to the N output ports of the 1:N port multiplexer; and

N output ports.

11. The memory circuit of claim 10, wherein the output stage further comprises:

N cascade input ports; and

N cascade output ports.

12. The memory circuit of claim 11, wherein:

the N cascade input ports are coupled to cascade output ports of a first different memory circuit; and the N cascade output ports are coupled to cascade input ports of a second different memory circuit.

13. A method, comprising:

receiving memory operations on N input ports, wherein N is an integer greater than one;

wherein each of the N input ports operates at a first data rate;

time division multiplexing the memory operations to a single port having a second data rate that is at least N times the first data rate;

providing the multiplexed memory operations from the single port to a random access memory matrix;

wherein the random access memory matrix operates at least at the second data rate;

implementing the memory operations in the random access memory matrix serially;

comparing a portion of an address for each memory operation received on the N input ports with a port specific identifier; and deactivating selected ones of the N input ports receiving the memory operations responsive to the comparing.

14. The method of claim 13, further comprising:

generating serial results for the memory operations that are output from the random access memory matrix;

de-multiplexing the results of the memory operations to N output ports; and outputting the results on the N output ports;

wherein each of the N output ports operates at the first data rate.

15. The method of claim 13, wherein:

the port identifier is port-specific across a plurality of memory structures; and each of the N input ports is deactivated responsive to a mismatch between the port identifier and the portion of the address.

16. The method of claim 15, further comprising:

applying a mask to a result of the comparison;

wherein the mask is port-specific across the plurality of memory structures.

17. The method of claim 15, further comprising:

generating an enable signal for each of the N input ports from the masked result of the comparison.

18. The method of claim 15, further comprising:

obtaining the port identifier and the mask identifier from configuration memory cells.

* * * * *